(12) United States Patent
Gotoh et al.

(10) Patent No.: US 7,400,365 B2
(45) Date of Patent: Jul. 15, 2008

(54) METHOD FOR MANUFACTURING A THIN FILM TRANSISTOR ARRAY SUBSTRATE FOR A LIQUID CRYSTAL DISPLAY DEVICE

(75) Inventors: Fumihiro Gotoh, Kumamoto (JP); Nobuaki Ishiga, Kumamoto (JP); Toshio Araki, Kumamoto (JP); Kazunori Inoue, Kumamoto (JP); Hiroyasu Itoh, Kumamoto (JP); Eiji Shibata, Kumamoto (JP); Masanao Nabeshima, Kumamoto (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 260 days.

(21) Appl. No.: 10/900,607

(22) Filed: Jul. 28, 2004

(65) Prior Publication Data

US 2005/0024549 A1  Feb. 3, 2005

(30) Foreign Application Priority Data

Jul. 28, 2003  (JP)  ............................ 2003-280771
Jan. 14, 2004  (JP)  ............................ 2004-007261

(51) Int. Cl.
*G02F 1/136* (2006.01)
*G02F 1/1345* (2006.01)

(52) U.S. Cl. ........................ 349/43; 349/152; 345/92; 257/59; 257/72

(58) Field of Classification Search ................ 349/43, 349/152; 257/59, 72; 345/92
See application file for complete search history.

(56) References Cited

U.S. PATENT DOCUMENTS 3,615,371 A * 10/1971 Nakajima et al. ........... 420/542
5,051,812 A * 9/1991 Onuki et al. ................ 257/758
6,081,308 A * 6/2000 Jeong et al. ................. 349/42
6,149,999 A * 11/2000 Suzuki et al. .............. 428/64.1
6,333,518 B1  12/2001 Sco ............................. 257/72

(Continued)

FOREIGN PATENT DOCUMENTS

JP  63095983 A * 4/1988

(Continued)

OTHER PUBLICATIONS

*Korean Patent Abstracts—English translation of the Abstract of Korean Publication No. 1020010063416.

(Continued)

*Primary Examiner*—Julie Ngo
(74) *Attorney, Agent, or Firm*—Ware, Fressola, Van Der Sluys & Adolphson LLP

(57) ABSTRACT

A method for manufacturing thin film transistor array substrate for a liquid crystal display device-includes:—(a) forming a first metal thin film layer on a insulating substrate and forming a gate wiring and a gate electrode by a first photolithography. (b) forming a gate insulating film layer, a semiconductor film layer, an ohmic contact film layer and a second metal thin film layer, and forming the thin film transistor by a second photolithography, (c) forming an interlayer insulating film, and forming a pixel contact hole, a first contact hole and a second contact hole by a third photolithography, and (d) forming a transparent conductive film, and forming a pixel electrode by a fourth photolithography. The first metal thin film has a two-layered structure comprising a first layer made of aluminum or aluminum alloy and a second layer located on said first layer, and the second metal thin film is formed of an alloy mainly containing molybdenum.

9 Claims, 12 Drawing Sheets

U.S. PATENT DOCUMENTS

| | | | |
|---|---|---|---|
| 6,355,548 B1 * | 3/2002 | Park ........................... | 438/591 |
| 6,495,383 B2 * | 12/2002 | Lyu ............................ | 438/30 |
| 6,525,341 B1 * | 2/2003 | Tsujimura et al. ............ | 257/59 |
| 6,570,161 B2 * | 5/2003 | You et al. ............. | 250/370.09 |
| 6,803,601 B2 * | 10/2004 | Nakajima .................... | 257/59 |
| 6,867,108 B2 * | 3/2005 | Jeong et al. ................ | 438/384 |
| 6,927,820 B2 * | 8/2005 | Jang et al. .................. | 349/114 |
| 7,105,896 B2 * | 9/2006 | Tanaka et al. ............... | 257/347 |
| 2004/0095544 A1 * | 5/2004 | Chang et al. ................ | 349/152 |
| 2005/0008834 A1 * | 1/2005 | Chang et al. ................ | 428/209 |

OTHER PUBLICATIONS

**Patent Abstracts of Japan, English translation of the Abstract of Japanese Publication No. 11-258625.

* cited by examiner

METHOD FOR MANUFACTURING A THIN FILM TRANSISTOR ARRAY SUBSTRATE FOR A LIQUID CRYSTAL DISPLAY DEVICE

BACKGROUND OF THE INVENTION

The present invention relates to a manufacturing method of a thin film transistor array substrate for a liquid crystal display and more particularly, it relates to a manufacturing method of an active matrix type of liquid crystal display (referred to as an LCD, hereinafter) using a thin film transistor (referred to as a TFT, hereinafter) as a switching element. More specifically, it relates to a manufacturing method of an active matrix type of liquid crystal display (TFT-LCD) using a TFT array substrate having fewer point defect and display uniformity, which is formed by four or five photolithography processes so as to have its display characteristics and productivity improved in a case where a low electric resistance wiring material is used as a gate wiring material and a source wiring material.

An electric optical element for a display using liquid crystal is increasingly applied to a product making use of a characteristic in which it is thin and power consumption is low, as a flat panel display instead of a CRT.

There are a passive matrix-type liquid crystal display and a TFT-LCD using the TFT as a switching element, as an electric optical element for display using liquid crystal. The TFT-LCD having characteristic superior to the passive matrix-type liquid crystal display in view of portability and visual quality has largely come into practical use for a notebook computer and the like. In the TFT-LCD, a liquid crystal layer is sandwiched between a TFT array substrate and an counter substrate in general. The TFT is formed in the shape of an array on the TET array substrate. Polarization plates are provided outside of the TFT array substrate and the counter substrate, and a backlight is provided outside of the substrate. In such constitution, preferably a color display is provided.

However, in the TFT-LCD, it is necessary to manufacture the TFT array substrate on which the TFT is formed in the shape of an array on a glass substrate using a semiconductor process technique, while various kinds of defects such as breaking of a wiring, short circuit between wirings or the like are likely to occur because of a pattern defect generated in the actual manufacturing process to cause a yield to be lowered and a manufacturing cost is increased because the number of devices required for manufacturing is increased.

As a method of solving the above problems, for example, Japanese Unexamined Patent Publication No. 10-268353 discloses a manufacturing method of an active matrix-type liquid crystal display in which a TFT array substrate is formed by five photolithography processes. In addition, Japanese Unexamined Patent Publication No. 250958/2001, Japanese Unexamined Patent Publication No. 339072/2001, Japanese Unexamined Patent Publication No. 26333/2002 and Japanese Unexamined Patent Publication No. 59939/2003 disclose an active matrix-type liquid crystal display in which a TFT array substrate is formed by four photolithography processes. Japanese Unexamined Patent Publication No. 339072/2001, Japanese Unexamined Patent Publication No. 26333/2002 and Japanese Unexamined Patent Publication No. 59939/2003 disclose a method of forming photo resist patterns having different film thickness by multiplex exposure using halftone mask.

FIGS. 11 to 13 are explanatory views showing an essential part of the conventional TFT array substrate disclosed in Japanese Unexamined Patent Publication No. 59939/2003, in which elements on an insulating substrate (not shown) are shown. FIG. 11 is a plane view, FIG. 12 is a sectional view schematically showing a sectional structure taken along line A-A in FIG. 11, and FIG. 13 is a view schematically showing a sectional structure of a terminal part for connecting a TCP (Tape Carrier Package) provided outside of a display region. The TOP connects a signal potential source which supplies a signal potential to be input to a gate wiring, a source wiring, a subsidiary capacitor wiring and a common electrode of an counter substrate, to the gate wiring, the source wiring, the subsidiary capacitor wiring and the common electrode, respectively.

Referring to FIGS. 11 to 13, reference numeral 1 designates a gate electrode, reference numeral 2 (not shown) designates a subsidiary capacitor electrode, reference numeral 3 designates a gate insulating film, reference numeral 4 designates a semiconductor film, reference numeral 5 designates an ohmic contact film, reference numeral 6 designates a drain electrode, reference numeral 7 designates a source electrode, reference numeral 8 designates an interlayer insulating film, reference numeral 9 designate a pixel contact hole, reference numeral 11 designates a pixel electrode, reference numeral 13 designates a gate terminal electrode, reference numeral 14 designates a gate terminal contact hole serving as a first contact hole, reference numeral 20 designates a subsidiary capacitor wiring, reference numeral 21 designates a gate wiring, reference numeral 22 designates a source wiring, reference numeral 23 designates a part of the ohmic contact film 5 shown on the plane view.

The gate electrode 1 is an electrode which is a part of the gate wiring 21, or a terminal branching off from the gate wiring 21 to be connected to each TFT. Referring to FIG. 11, the part designated by reference numeral 23 has upper and lower two-layer structure of the ohmic contact film 5 and the semiconductor film 4 in FIG. 12.

According to the manufacturing method in which the TFT array substrate is formed by four photolithography processes disclosed in the prior art, since the source wiring 22 and the source electrode 7 do not climb over bumps of the semiconductor film and the ohmic contact film 23 in the display, breaking of the source wiring 22 and the source electrode 7 caused by the bumps of the semiconductor active film and the ohmic contact film 23 can be prevented, and since the patterns of the source electrode and the drain electrode are included in a semiconductor pattern so that they do not cross each other, a leak current can be also kept low. In addition, according to Japanese Unexamined Patent Publication No. 10-268353, although a semiconductor active film and an ohmic contact film 23 are left in the vicinity of a pixel electrode 11, since the pixel electrode 11 is separated from the semiconductor film, the ohmic contact film 23 and a source wiring 22 at an interlayer insulating film 8, a simple short circuit between the source wiring 22 and the pixel electrode 11 caused by pattern defects of the semiconductor film, the ohmic contact film 23 and the source wiring 22, or a short circuit when resistance of the semiconductor film 4 is lowered under irradiation of light can be eliminated.

Meanwhile, in a field of the TFT-LCD, it is demanded that electric resistance of a wiring material is lowered to avoid accordingly increasing wiring electric resistance because of trends for a wiring length to be increased and a width of a wiring to be reduced, which are accompanied by trends of increasing a panel size and fine pixel size for TV or monitor of recent years. As wiring materials conventionally used in general, there are titanium (Ti), chrome (Cr), tantalum (Ta), tungsten (W) and an alloy mainly containing these. Among the above, Cr which can be processed in a relatively easy manner by wet etching having high productivity, and shows a low resistance value and high corrosion resistance, has been used widely. However, aluminum (Al), molybdenum (Mo) and an alloy of these having specific electric existence further lower than the above are preferably being used for the future.

However, in the conventional TFT array substrate constitution disclosed in Japanese Unexamined Patent Publication No. 10-268353, when an Al film is used for a metal thin film material of the gate wiring 21 and the source wiring 22 as a low electric resistance wiring, small projections called hillocks are generated on the Al film surface by heating and an interlayer insulation defect is generated. In addition, an oxide layer is formed between the gate wiring 21 and the source wiring 22, and the electrically connected pixel electrode 11, and contact electric resistance at the connection parts of the gate wiring 21/the pixel electrode 11 and the source wiring 22/the pixel electrode 11 is increased so that a display visual defect is generated. Furthermore, when the Al film is used for the metal thin film material of the source wiring 22, contact electric resistance at a connection part between the source wiring 22 and the ohmic contact film 23 electrically connected thereto is increased, so that a display defect is generated.

Still further, when a Mo film is used for a metal thin film material of the gate wiring 21 or the source wiring 22, although contact electric resistance with the pixel electrode 11 and contact electric resistance with the ohmic contact film 23 is preferable, there is a problem that water corrosion resistance is low and reliability is lowered, or a problem that the Mo film is excessively etched during a dry etching process for forming the pixel contact hole 9 in the interlayer insulating film 8 and a contact defect is generated because there is no Mo film at a contact hole opening. Still further, when a multilayer laminated structure combining Al and Mo is provided to compensate for the defects of the Al film and the Mo film, when Al is etched using a chemical agent containing well-known phosphoric acid and nitric acid group, since the laminated Mo layer is excessively etched away, the etching process cannot be performed, which is a serious problem.

In other words, it is substantially impossible to implement the TFT-LCD in which low resistance metal such as Al or Mo is used as it is for the wiring material by the above manufacturing method.

SUMMARY OF THE INVENTION

The present invention is made in view of the above circumstances, and it is an object of the present invention to provide a manufacturing method of a thin film transistor array substrate of a liquid crystal display by which a TFT array substrate of high quality in which pixel point defect or a visual defect is not generated, can be manufactured with high production efficiency.

According to the present invention, there is provided a manufacturing method of thin film transistor array substrate for a liquid crystal display, in which display pixels having a pixel electrode electrically connected to a thin film transistor are formed in the shape of array on a first insulating substrate; a TFT array substrate in which a gate wiring sequentially scanning and selecting each thin film transistor along the lines, and a source wiring applying a wiring signal to the pixel electrode are formed so as to cross each other in the shape of a matrix, and an counter substrate in which color filters and a common electrode are formed on a second insulating substrate, are attached through a liquid crystal layer; and polarization plates are provided outsides of the TFT array substrate and the counter substrate, respectively. The manufacturing method comprises at least (A) a step of forming a first metal thin film on the first insulating substrate, and patterning the first metal thin film by the first photolithography to form a gate wiring and the gate electrode of the thin film transistor, (B) a step of forming a gate insulating film, a semiconductor film, an ohmic contact film and a second metal film sequentially, forming a photo resist pattern by the second photochemical engraving so as to contain a first part positioned at a semiconductor active layer corresponding part for forming the thin film transistor, a second part thicker than the first part and a third part thicker than the first and second parts, etching the second metal film, the ohmic contact film and the semiconductor film, thinning the resist, removing the resist of the first part positioned at the semiconductor active layer corresponding part, removing the second metal film at the first part positioned at the semiconductor active layer corresponding part by etching and removing the ohmic contact film at the semiconductor active layer corresponding part to form the thin film transistor having the semiconductor active layer; (C) a step of forming an interlayer insulating film and patterning the interlayer insulating film and the gate insulating film by the third photolithography to form a pixel contact hole reaching at least the drain electrode surface, a first contact hole reaching the first metal thin film surface, and a second contact hole reaching the second metal thin film surface; and (D) a step of forming a transparent conductive film and forming a pixel electrode having a part connected to the drain electrode through the pixel contact hole, a gate terminal connected to the gate wiring through the first contact hole and a source terminal connected to the source wiring through the second contact hole by the fourth photolithography, and the second metal thin film is formed of an alloy mainly containing molybdenum.

The first metal thin film may have at least two-layered structure comprising a first layer made of aluminum or aluminum alloy and a second layer located on said first layer. The second layer is obtained by adding at least one element of nitrogen, carbon and oxygen as a dopant to the aluminum or aluminum alloy. The aluminum alloy comprises aluminum as a main component, and at least one of titanium, vanadium, chrome, zirconium, niobium, molybdenum, hafnium, tantalum, tungsten, lanthanum, neodymium, samarium, gadolinium and yttrium is added to aluminum. The aluminum alloy may comprise an alloy containing neodymium of 0.1 to 5% by weight.

The second metal thin film may be molybdenum alloy comprising molybdenum as a main component, and at least one of titanium, vanadium, chrome, zirconium, niobium, tantalum and tungsten is added to molybdenum. The second metal thin film may also be molybdenum alloy comprising molybdenum as a main component, and the molybdenum alloy may contain niobium of 2.5 to 20% by weight.

The transparent conductive film may comprise indium oxide, tin oxide, zinc oxide or mixture of at least two of indium oxide, tin oxide or zinc oxide.

According to the present invention, the TFT array substrate of high quality in which pixel point defect or a visual defect is not generated, can be manufactured with high production efficiency.

DETAILED DESCRIPTION

Figure 4:
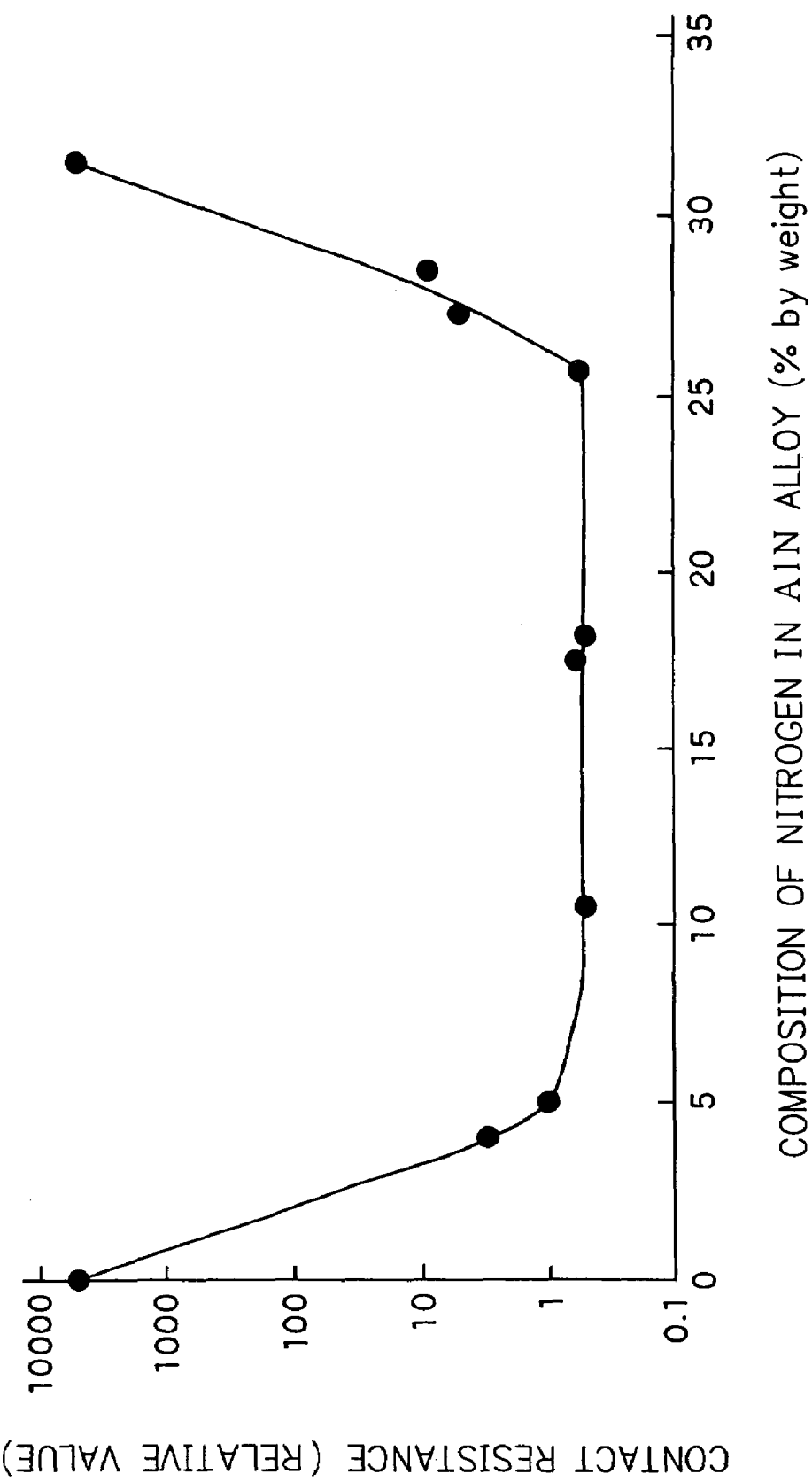
FIG. 4 is a graph showing dependency of nitrogen composition in AlN Alloy of ITO/AlN contact electric resistance values of Embodiments 1 to 5 of the present invention.

The inventors of the present invention have provided various kinds of considerations to solve the above problems in the Al film or the Mo film. FIG. 4 shows a result of contact electric resistance values between a transparent pixel electrode ITO film and AlN film when nitrogen (N) is added to Al as an impurity, in which a reference value of the contact electric resistance so as not to generate a display visual defect is set at 1. It is found that the contact electric resistance value between the gate wiring 21 and the pixel electrode 11 can be lowered and hillocks are prevented from being generated by adding nitrogen (N) by 5 to 26% by weight as an impurity to an upper surface of an Al alloy which is directly in contact with at least the ITO film of the gate wiring 21. Then, it is also confirmed that the contact electric resistance between the gate wiring 21 and the pixel electrode 11 can be lowered by adding at least one of carbon (C) and oxygen (O) as an impurity other than nitrogen (N). In addition, Table 1 shows thermal resistance of hillocks, a side etching amount from a resist pattern edge when wet etching is performed for twice as long as a just etching time (overetching 100%) using a chemical agent containing well-known phosphoric acid, nitric acid and acetic acid, and a relation between a specific electric resistance value of an AlNd film and Nd composition dependency of hillock characteristics. In addition, a hillock number density shows a total number of the hillock included in an AlNd film having an area of 500 μm².

TABLE 1

| No. of Embodiments | Sample | hillock density/annealing temperature (holding time: 60 minutes) | | | | | specific electric resistance (μΩcm) | side etching amount on both sides (μm) |
| --- | --- | --- | --- | --- | --- | --- | --- | --- |
| | | 300° C. | 325° C. | 350° C. | 400° C. | 450° C. | | |
| 1 | Al—Nd of 0.8% by weight | 0 | 0 | 8 | 14 | 18 | 3.6 | 1.6 |
| 2 | Al—Nd of 2% by weight | 0 | 0 | 0 | 11 | 14 | 4.5 | 1.6 |
| 3 | Al—Nd of 5% by weight | 0 | 0 | 0 | 12 | 12 | 4.7 | 2.6 |
| 4 | Al—Nd of 10% by weight | 0 | 0 | 0 | 0 | 0 to 1 | 8.3 | 3.2 |
| Com. Ex. | pure Al | 9 | — | 10 | 17 | — | 3.3 | 1.0 |

As shown in Table 1, it is found that small projections called hillocks can be prevented from being generated on a film surface and an interlayer insulating defect can be reduced by adding neodymium (Nd) as an impurity to Al of the gate wiring 21 by 0.8% by weight or more, at a process heating temperature of 325° C. or less. Meanwhile, it is found that when the adding amount exceeds 5% by weight, the side etching amount is extremely increased at the time of wet etching and it is hard to control a pattern size, and the specific electric resistance value after being annealed at 300° C., exceeds 5 μΩcm, which reduces an original merit of the Al alloy system film such as low electric resistance. Therefore, there is provided knowledge to prevent generation of the hillocks and to minimize reduction of a wiring width by side etching at the time of the wet etching, an alloy in which Nd of 0.8 to 5% by weight is added to Al is preferably used. In addition, when at least Nd of 0.1% by weight is added, the hillocks can be prevented from being generated at a temperature of 300° C. or less. Although it is confirmed that the same effect can be provided by adding at least one of titanium (Ti), vanadium (V), chrome (Cr), zirconium (Zr), niobium (Nb), molybdenum (Mo), hafnium (Hf), tantalum (Ta), tungsten (W), lanthanum (La), samarium (Sm), gadolinium (Gd) and yttrium (Y), other than Nd, when Nd is added, an increase in the specific electric resistance value can be minimized as compared with the case another element is added.

Table 2 shows specific electric resistance values, water corrosion resistance, ITO/Mo alloy contact electric resistance, and a result (added element characteristic of Mo alloy) of a selected ratio of dry etching rate to SiN (hereinafter, referred to as dry etching selected ratio).

TABLE 2

| | specific electric resistance | water resistance (dipping in pure water) | ITO contact electric resistance | dry etching selected ratio (To SiN) |
|---|---|---|---|---|
| pure Mo | ○ | X (film was lost after a month) | ○ | X (0.5) |
| added element | | | | |
| V | X | ○ (film was lost after a month) | — | ◎ |
| Cr | X | — | — | ◎ |
| Zr | X | — | — | ◎ |
| Nb | ○ | ◎ (there was no change after a month) | ○ | ◎ (0.25) |
| W | ○ | ○ (film was lost after a month) | ○ | ◎ |

As compared with pure Cr in Comparative Example, while pure Mo is excellent in characteristics of the specific electric resistance and the contact electric resistance with ITO, it is inferior in water corrosion resistance and SiN dry etching selected ratio, which means it is difficult to use pure Mo in the TFT array substrate. As far as the SiN dry etching selected ratio is concerned, it can be improved by adding various kinds of elements such as V, Cr, Zr, Nb and W to pure Mo.

Figure 5:
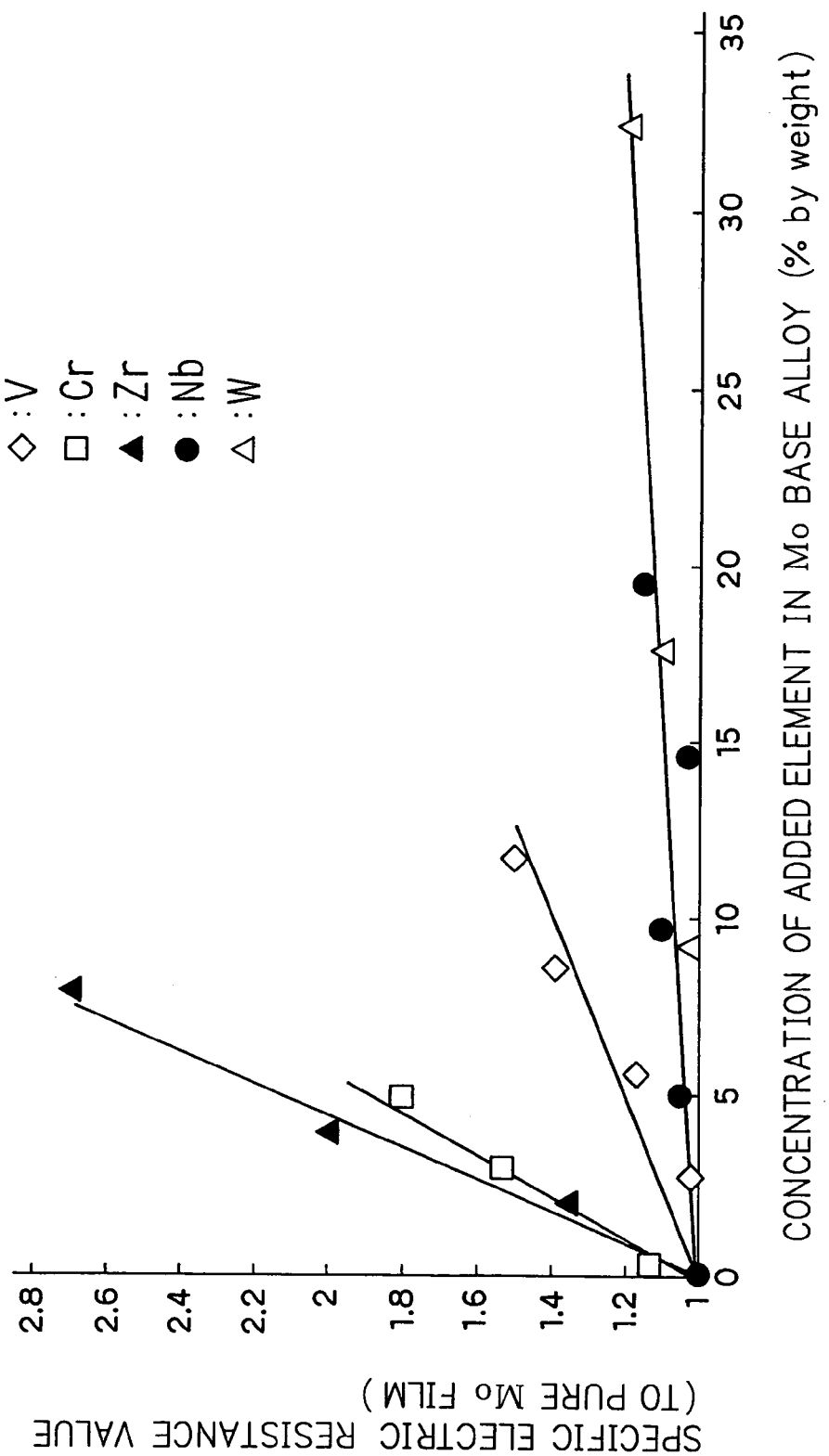
FIG. 5 is a graph showing dependency of added element composition in Mo alloy of specific electric resistance values of a Mo alloy of Embodiments 1 to 5 of the present invention.
Figure 6:
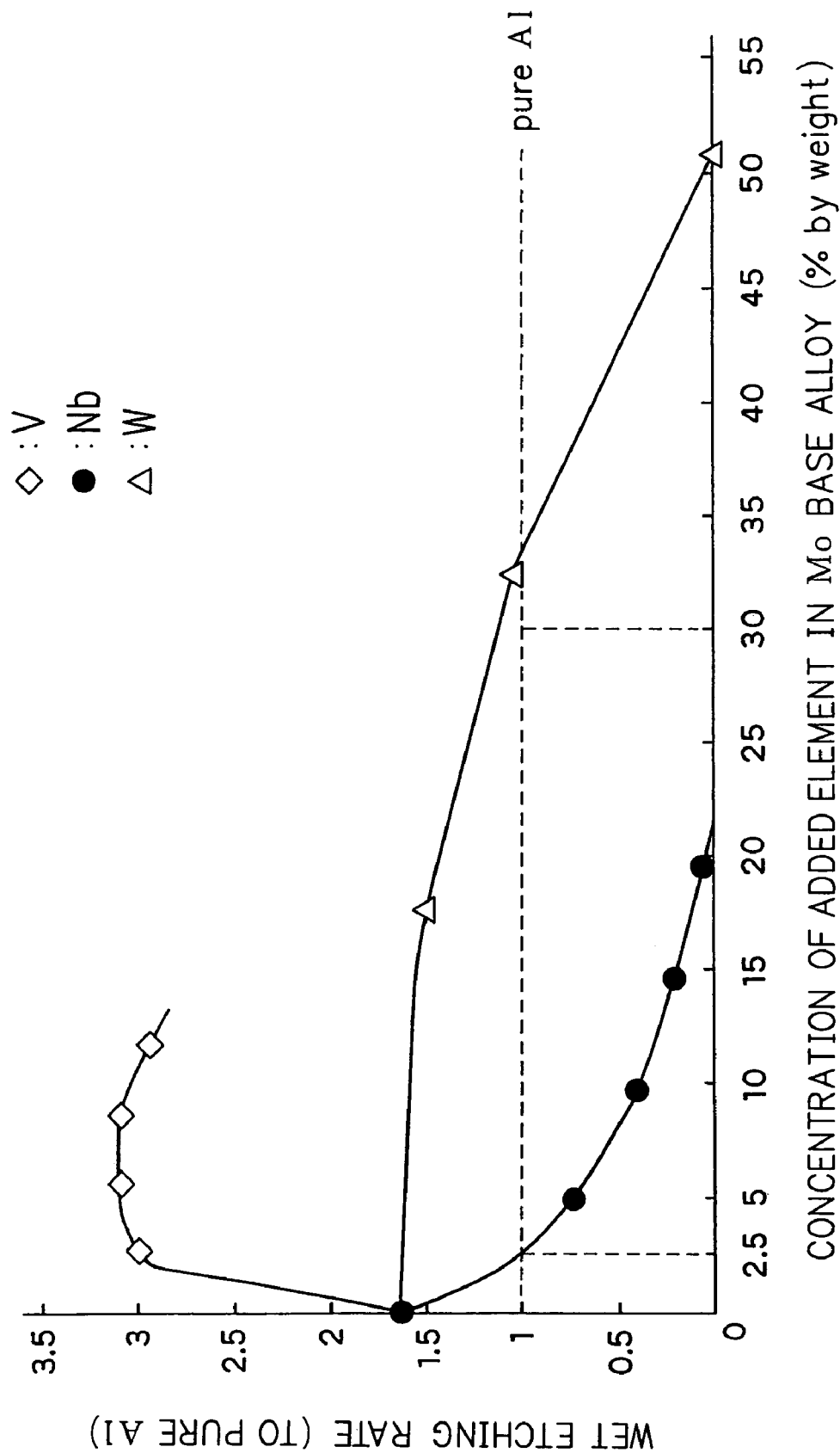
FIG. 6 is a graph showing dependency of added element composition in Mo alloy of wet etching rates of the Mo alloy of Embodiments 1 to 5 of the present invention.

FIG. 5 shows specific electric resistance values of the Mo alloy film to the pure Mo film (in which the specific electric resistance value of pure Mo is set at 1). It is seen that when Nb or W is added, an increase in specific electric resistance value can be largely prevented. FIG. 6 shows a etching rate of the Mo alloy film when a chemical agent containing well-known phosphoric acid, nitric acid and acetic acid is used as a standard etching solution of Al group. In FIG. 6, it can be seen that the etching rate of the Mo alloy film in which Nb of about 2.5% by weight is added to the Mo alloy, or the Mo alloy film in which W of about 30% by weight is added to the Mo alloy becomes the same as in the pure Al film when pure Al is set at 1, and the laminated film of Al and Mo can be etched away by one step. When the Mo alloy film and the Al film are laminated, it is preferable that the film thickness of the Mo alloy film is thinner than that of the Al film to make the low specific electric resistance value of Al effective. Therefore, considering a volume ratio of each layer of the Mo alloy/Al laminated film, since the wet etching rate ratio of the Mo alloy film to Al is preferably 1 or less to smooth the etching section, concentration of Nb to be added to Mo is preferably 2.5% by weight or more, or concentration of W to be added is preferably 30% by weight or more. Meanwhile, it is found that when Nb exceeding 20% by weight is added, or when W exceeding 30% by weight is added, since wet etching processing with high productivity cannot be performed, it is not suitable for the metal thin film material of the present invention. As a result, there is provided knowledge that the Mo alloy film in which Nb of 2.5 to 20% by weight is added to Mo or the Mo alloy film in which W of 30 to 50% by weight is added to Mo is preferably used in the present invention.

Table 3 shows a result of water corrosion resistance test in which the Mo alloy film is soaked and left in pure water at 23° C. (dependency of an added element composition of water corrosion resistance of the Mo alloy). Since the Mo alloy film in which Nb is added to Mo is not corroded and almost the same resistance as in the Cr film of Comparative Example is shown, it is found that the alloy film containing Nb of 2.5 to 20% by weight in Mo is further preferably used in the present invention.

TABLE 3

| No. of Embodiments | metal | After a week | After a month |
|---|---|---|---|
| 5 | Mo—Nb of 5% by weight | ○ (no change) | ○ (no change) |
| 6 | Mo—Nb of 20% by weight | ○ (no change) | ○ (no change) |
| 7 | Mo—W of 18% by weight | Δ (discolored) | X (film was almost lost) |
| 8 | Mo—W of 50% by weight | Δ (discolored) | X (film was almost lost) |
| 9 | Mo—V of 6% by weight | Δ (discolored) | X (film was almost lost) |
| 10 | Mo—V of 12% by weight | Δ (discolored) | X (film was almost lost) |
| 11 | pure Mo | Δ (discolored) | X (film was almost lost) |
| Com. Ex. | pure Cr | ○ (no change) | ○ (no change) |

According to the result of the above knowledge, the inventors of the present invention completed the present invention by providing the method of manufacturing the TFT array substrate for the liquid crystal display having high display quality with high productivity in which electric resistance of the gate wiring and the source wiring can be minimized, contact electric resistance of the pixel electrode and the drain electrode can be minimized and there is no pixel point defect nor display unevenness, by using the two-layer film comprising Al or an alloy mainly containing Al and an Al alloy formed thereon in which at least one of N, C and O is added to Al as a first metal thin film, using a single layer film of a Mo alloy in which especially Nb among Nb and W is added, or using a laminated layer structure of the Al alloy and the Mo alloy as a second metal thin film, and constituting the first and second metal thin films so as to be processed by wet etching.

Hereinafter, a description is made of the TFT array substrate for the liquid crystal display according to embodiments of the present invention with reference to the drawings.

Embodiments 1

Figure 1:
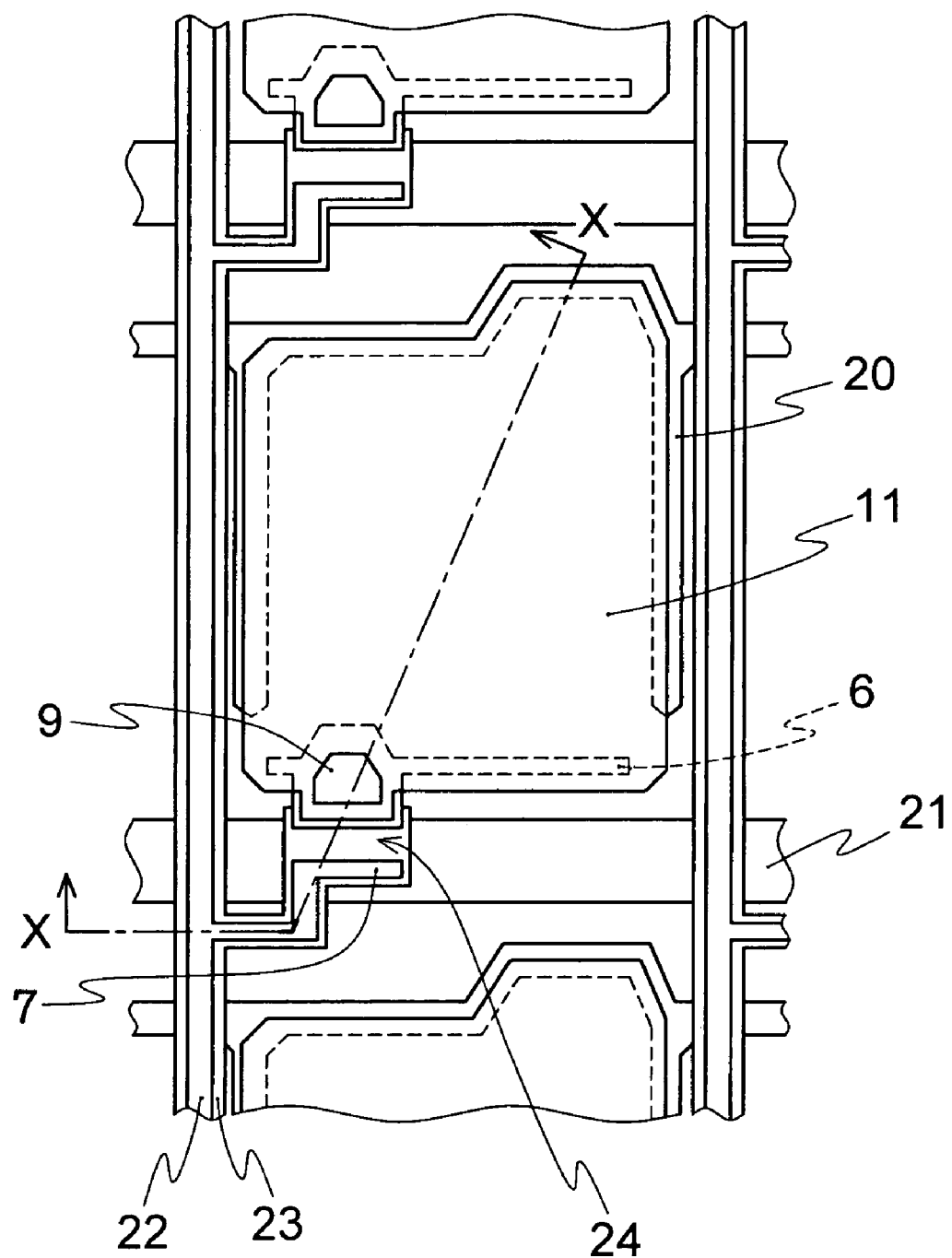
FIG. 1 is a plane view showing a TFT array substrate for a liquid crystal display of Embodiments 1, and 3 to 5 of the present invention.
Figure 2:
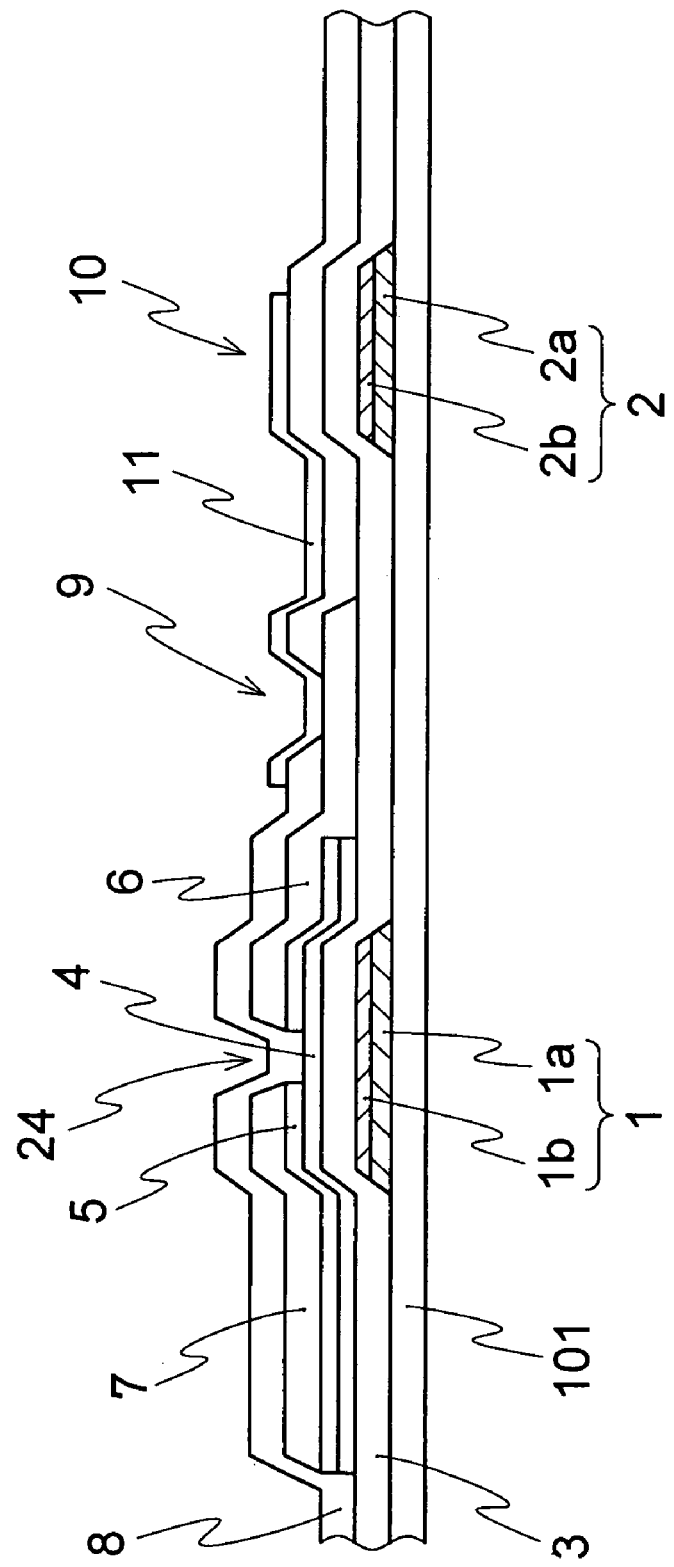
FIG. 2 is a sectional view taken along line X-X in FIG. 1.

FIG. 1 is a plane view showing a TFT array substrate for a liquid crystal display according to Embodiment 1 of the present invention. FIG. 2 is a sectional view taken along line X-X in FIG. 1. Referring to FIGS. 1 and 2, reference numeral 101 designates a transparent insulating substrate such as a glass substrate, reference numeral 1 designates a gate electrode formed of a first metal thin film on the transparent insulating substrate 101, reference numeral 21 designates a gate wiring connected to the gate electrode 1, reference numeral 2 designates a subsidiary capacitor electrode formed of the first metal thin film on the transparent insulating substrate 101, reference numeral 3 designates a gate insulating film formed on the gate electrode 1, the gate wiring 21 and the subsidiary capacitor electrode 20, reference numeral 4 designates a semiconductor active layer formed of an amorphous silicon film on the gate electrode 1 through the gate insulating film 3, reference numeral 5 designates an ohmic contact layer formed of an n+ amorphous silicon film on the semiconductor active layer 4, reference numeral 7 designates a source electrode formed of a second metal thin film on the ohmic contact layer 5, reference numeral 22 designates a source wiring connected to the source electrode 7, reference numeral 6 designates a drain electrode formed of the second metal thin film on the ohmic contact layer 5, reference numeral 24 designates a channel part of the TFT (a part corresponding to a semiconductor active layer) from which the ohmic contact layer is removed, reference numeral 8 designates an interlayer insulating film formed of a passivation film, reference numeral 9 designates a pixel contact hole reaching a drain electrode surface, and reference numeral 11 designates a pixel electrode formed of a transparent conductive film, which is electrically in contact with the lower drain electrode 6.

Figure 3:
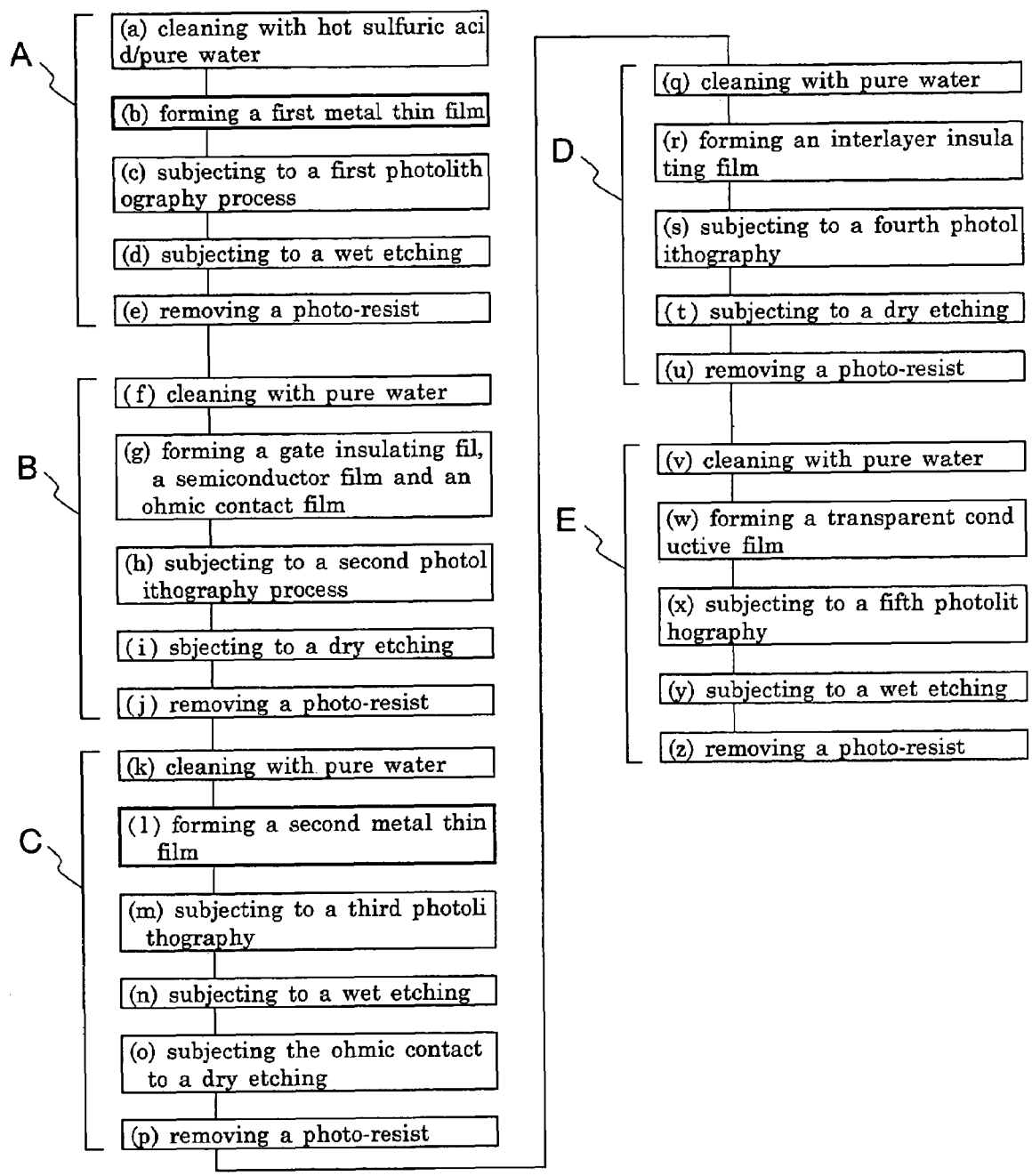
FIG. 3 is a flowchart showing manufacturing steps of the TFT array substrate for the liquid crystal display of Embodiments 1 and 3 to 5 of the present invention.

Next, a description is made of procedures of a manufacturing method for the TFT array substrate for a liquid crystal display according to Embodiment 1 of the present invention with reference to FIG. 3.

According to a step A shown in FIG. 3, the transparent insulating substrate 101 such as the glass substrate is cleaned with purified water or hot sulfuric acid, a first metal thin film is formed on the transparent insulating substrate 101, and the first metal thin film is patterned by the first photolithography to form the gate electrode 1, the gate wiring 21 and the subsidiary capacitor electrode 2. As the first metal thin film, Al or Mo having low specific electric resistance or an alloy mainly composed of those is preferably used. As a preferred embodiment, first, an Al film 1a is formed to be 200 nm in thickness by sputtering using well-known Ar gas. A sputtering condition is such that a deposition power density is 3 W/cm$^2$ and an Ar gas flow rate is 40 sccm in a DC magnetron sputtering system. Then, an AlN alloy 1b added with nitrogen (N) is formed to be 50 nm in thickness by reactive sputtering using gas in which $N_2$ gas is mixed with well-known Ar gas. A sputtering condition is such that a deposition power density is 3 W/cm$^2$, an Ar gas flow rate is 40 sccm, and a $N_2$ gas flow rate 20 sccm. Thus, two-layer film having the Al film 1a having a thickness of 200 nm and the AlN film 1b having a thickness of 50 nm formed thereon is formed. In addition, an N element composition of the upper AlN film 1b and 2b is about 18% by weight. Then, the two-layer film 1a and 2a, and 1b and 2b is etched away together by using a chemical agent containing well-known phosphoric acid and nitric acid and a photo-resist pattern is removed to form the gate electrode 1, the gate wiring 21 and the subsidiary capacitor electrode 2.

Then, according to a step B shown in FIG. 3, the gate insulating film 3 comprising silicon nitride (SiN), the semiconductor active layer 4 comprising amorphous silicon, and the ohmic contact film 5 comprising n+ amorphous silicon to which an impurity is added are sequentially formed, and then the semiconductor active film, the ohmic contact film and a part forming a thin film transistor are patterned by the second photolithography and etching so as to have a configuration which is continuous and larger than patterns of the source electrode 7, the source wiring 22 and the drain electrode 6 which are to be formed in a later process. As a preferred embodiment, a SiN film as the gate insulating film having a thickness of 400 nm, an amorphous silicon film as the semiconductor film having a thickness of 150 nm, and an n+ amorphous silicon film to which phosphorus (P) is added as an impurity, as the ohmic contact film having a thickness of 30 nm are sequentially formed by a chemical vapor deposition (CVD) method. Then, the amorphous silicon film and the ohmic contact film are etched away by dry etching using well-known fluorine-contained gas and then a photo-resist pattern is removed to form the semiconductor patterns 4 and 5.

Then, according to a step C shown in FIG. 3, a second metal film is formed and patterned by the third photolithography and etching to form the source electrode 7, the source wiring 22 and the drain electrode 6. As the second metal thin film, an alloy film in which Nb or W is added to Mo having advantages in which a specific electrical resistance is low as described above, preferable contact characteristics with the ohmic contact film 5 is provided and contact electric resistance with the pixel electrode 11 is preferable is preferably used. As a preferable embodiment, a MoNb alloy in which Nb of 5% by weight is added to Mo is formed to be 200 nm in thickness by sputtering using well-known Ar gas and etched away using the chemical agent containing well-known phosphoric acid and nitric acid, the ohmic contact layer between the source electrode 7 and the drain electrode 6 is removed by dry etching using well-known fluorine-contained gas, and the photo-resist pattern is removed to form the source electrode 7, the source wiring 22, the drain electrode 6 and the TFT channel part 24.

Then, according to a step D shown in FIG. 3, a passivation film formed of SiN is formed as the interlayer insulating film 8 and patterned by the fourth photolithography and etching to form the pixel contact hole reaching at least a drain electrode surface of the second metal thin film, a first contact hole reaching a gate wiring terminal surface of the first metal thin film, and a second contact hole reaching a source wiring terminal surface of the second metal thin film at the same time. As a preferable embodiment, A silicon nitride SiN film is formed so as to be 300 nm in thickness as the interlayer insulating film by the chemical vapor deposition (CVD) method and etched away by dry etching using well-known fluorine-contained gas and then the photo-resist pattern is removed to form the pixel drain electrode contact hole 9, a gate terminal part contact hole (not shown) and a source terminal part contact hole (not shown).

Then, according to a step E shown in FIG. 3, a transparent conductive film is formed and patterned by the fifth photolithography and etching to form the pixel electrode 11 so as to be electrically connected to the lower layer of the drain electrode 6 through the pixel drain electrode contact hole 9, and a terminal pad pattern so as to be electrically connected to the lower gate terminal part and the lower source terminal part through the contact hole, so that the TFT array substrate for liquid crystal display according to the embodiment 1 of the present invention is completed. As a preferred embodiment, an ITO film in which indium oxide ($In_2O_3$) and tin oxide ($SnO_2$) are mixed is formed to be 100 nm in thickness as the transparent conductive film by sputtering using well-known Ar gas and etched away using the chemical agent containing well-known hydrochloric acid and nitric acid and the photo-resist pattern is removed to form the pixel electrode 11 and a gate terminal pad and a source terminal pad (not shown).

Compared with the conventional TFT array substrates (Comparative Examples 1 and 2) in which the first metal thin film is formed of a Cr or Al film and the second metal thin film is formed of a Cr film, in view of characteristics of the TFT array substrate for the liquid crystal display of the present invention and the conventional TFT array substrate (Comparative Example) shown in Table 4, in the TFT array substrate completed as described above, the gate wiring electric resistance and the contact electric resistance of the terminal pad with the ITO film can be reduced by forming the first metal thin film with two-layer film of AlN/Al, and hillocks are prevented from being generated, so that an interlayer short-circuit defect between the first and second metal thin films through the insulating film can be prevented from being generated. Furthermore, since the second metal thin film is formed of MoNb, the source wiring electric resistance can be reduced and the contact electric resistance with the pixel ITO can be especially reduced, thereby to implement excellent display quality in which there is no display visual defects.

TABLE 4

|  | Embodiment | | | | | Com. Ex. | |
| --- | --- | --- | --- | --- | --- | --- | --- |
|  | 1, 2 | 1, 2 | 3 | 4 | 5 | 1 (reference) | 2 |
| first metal thin film (gate wiring) | AlN/Al | AlN/Al | MoNb | AlN/Al | MoNb/(AlN)/Al | Cr | Al |
| second metal thin film (source wiring) | MoNb | MoW | MoNb | MoNb/Al/MoNb or AlN/Al/MoNb | MoNb/Al/MoNb or AlN/Al/MoNb | Cr | Cr |
| pixel electrode/ terminal pad ITO film | ITO | ITO | ITO | ITO | ITO | ITO | ITO |
| gate wiring electric resistance (To Cr wiring) | 0.2 | 0.2 | 0.6 | 0.2 | 0.2 | 1 | 0.2 |
| source wiring electric resistance (To Cr wiring) | 0.6 | 0.6 | 0.6 | 0.2 | 0.2 | 1 | 1 |
| ITO/ gate wiring contact electric resistance | 1 | 1 | 0.4 | 1 | 0.4 | 1 | 1000000 |
| ITO/ source wiring contact electric resistance | 0.4 | 0.6 | 0.4 | 0.4 | 0.4 | 1 | 1 |

Although the first metal thin film comprises the two-layer film of the lower pure Al film 1a and 2a and the upper AlN films 1b and 2b to which nitrogen of about 18% by weight is added in Embodiment 1, the present invention is not limited to this. For example, as shown in FIG. 4, nitrogen may be added in a range of 5 to 26% by weight. Alternatively, C or O may be added instead of nitrogen. A kind of an element and its amount to be added can be easily changed only by appropriately changing a kind of gas and its flow rate to be mixed to Ar gas. For example, oxygen gas, carbon dioxide gas or atmospheric gas may be mixed with Ar gas instead of nitrogen gas to perform the reactive sputtering. In addition, instead of the pure Al film, there may be provided a two-layer film of AlNd—N/AlNd using an AlNd alloy film in which Nd is added by 0.1 to 5% by weight. In this case, in addition to the effect that the gate wiring electric resistance is reduced and the contact electric resistance with ITO film is reduced, since a margin for preventing generation of the hillocks in the process of heating can be raised, a product yield and reliability can be improved, which is more preferable.

In addition, as the second metal thin film, a MoW alloy film to which W is added by 30 to 50% by weight can be used instead of the MoNb alloy film. In this case, although the contact electric resistance with the ITO film is increased a little as compared with the case of MoNb, the source wiring electric resistance and the contact electric resistance with the ITO film can be reduced as compared with Comparative Example 1.

Embodiment 2

Figure 7:
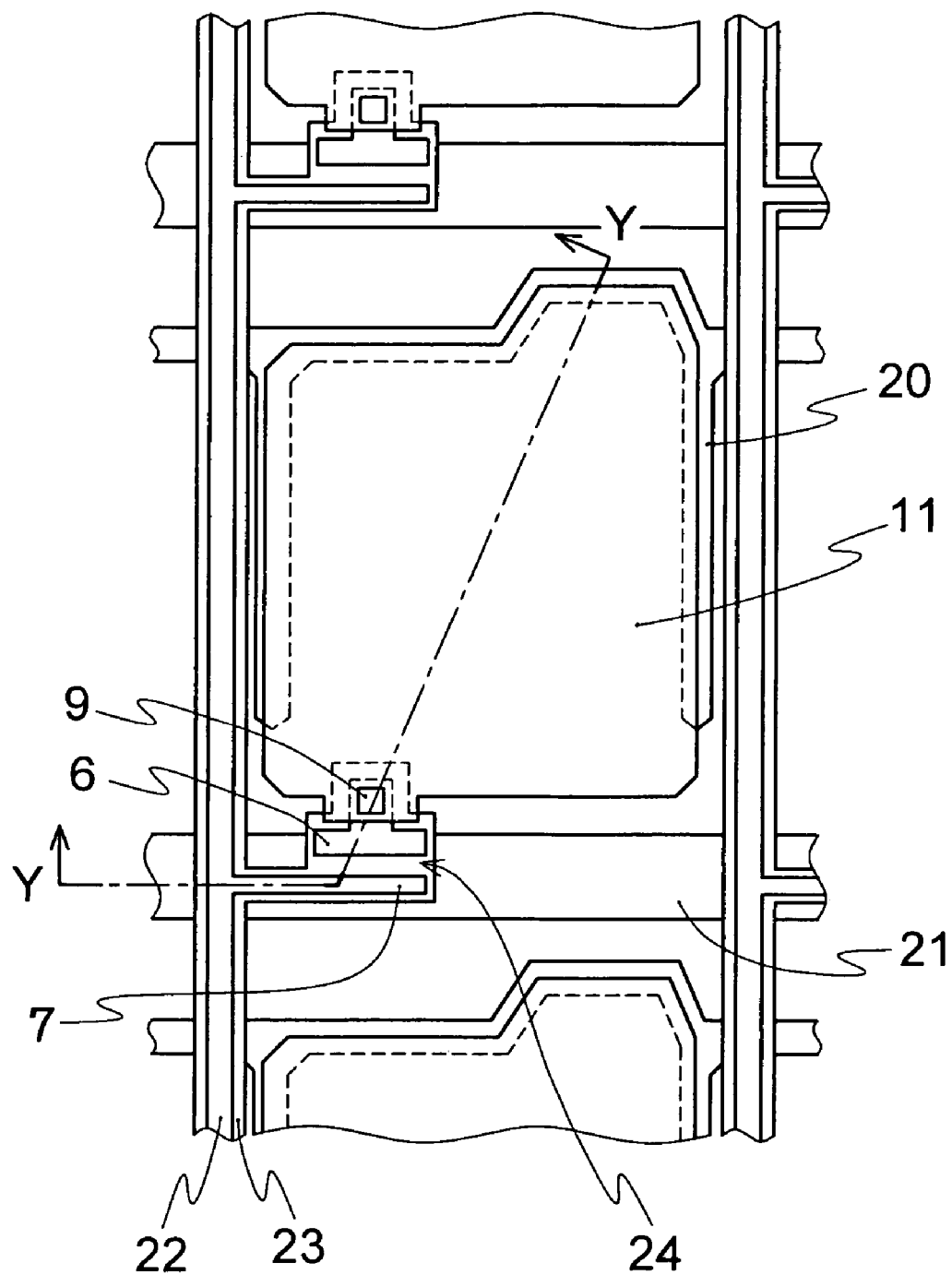
FIG. 7 is a plane view showing a TFT array substrate for a liquid crystal display of Embodiments 2 to 5 of the present invention.
Figure 8:
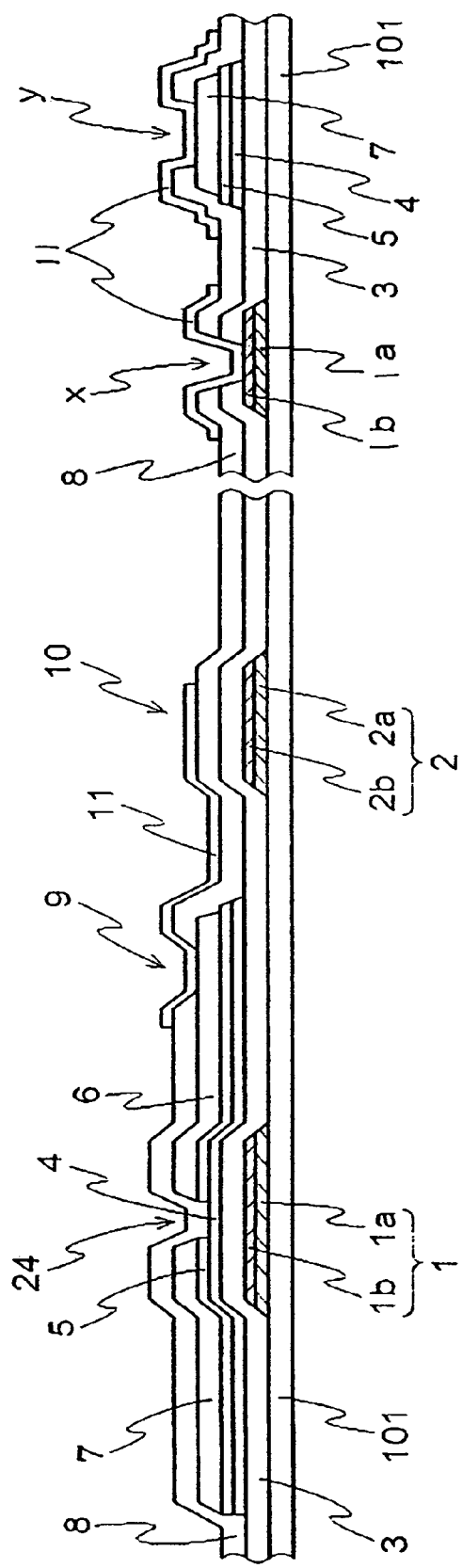
FIG. 8 is a sectional view taken along line Y-Y in FIG. 7.

FIG. 7 is a plane view showing a TFT array substrate for a liquid crystal display according to Embodiment 2 of the present invention. FIG. 8 is a sectional view taken along line Y-Y in FIG. 7. Referring to FIGS. 7 and 8, reference numeral 101 designates a transparent insulating substrate such as a glass substrate, reference numeral 1 designates a gate electrode formed of a first metal thin film on the transparent insulating substrate 101, reference numeral 21 designates a gate wiring connected to the gate electrode 1, reference numeral 2 designates a subsidiary capacitor electrode formed of the first metal thin film on the transparent insulating substrate 101, reference numeral 3 designates a gate insulating film formed on the gate electrode 1, the gate wiring 21 and the subsidiary capacitor electrode 20, reference numeral 4 designates a semiconductor active layer formed of an amorphous silicon film on the gate electrode 1 through the gate insulating film 3, reference numeral 5 designates an ohmic contact layer formed of an n+ amorphous silicon film on the semiconductor layer 4, reference numeral 7 designates a source electrode formed of a second metal thin film on the ohmic contact layer 5, reference numeral 22 designates a source wiring connected to the source electrode 7, reference numeral 6 designates a drain electrode formed of the second metal thin film on the ohmic contact layer 5, reference numeral 24 designates a channel part of the TFT (a part corresponding to a semiconductor active layer) from which the ohmic contact layer is removed, reference numeral 8 designates an interlayer insulating film, reference numeral 9 designates a pixel contact hole reaching a drain electrode surface, reference numeral 10 designates a part forming subsidiary capacitor (hereinafter, referred to as a subsidiary capacitor) and reference numeral 11 designates a pixel electrode formed of a transparent conductive film, which is electrically in contact with the lower drain electrode 6. In addition, the subsidiary capacitor electrode 2 branches off from the subsidiary capacitor wiring 20 and extends to a position in which a part of it overlaps with the pixel electrode 11. The subsidiary capacitor 10 is formed between the subsidiary capacitor electrode 2 and pixel electrode 11, using a laminated film comprising the gate insulating film 3 and the interlayer insulating film as a dielectric. The subsidiary capacitor 10 is formed in parallel with liquid crystal capacitor formed between the pixel electrode 11 and the common electrode through a liquid crystal as an electric circuit.

Next, a description is made of procedures of a manufacturing method of the TFT array substrate for the liquid crystal display according to Embodiment 2 of the present invention with reference to FIGS. 9 and 10(a), 10(b), and 10(c).

Figure 9:
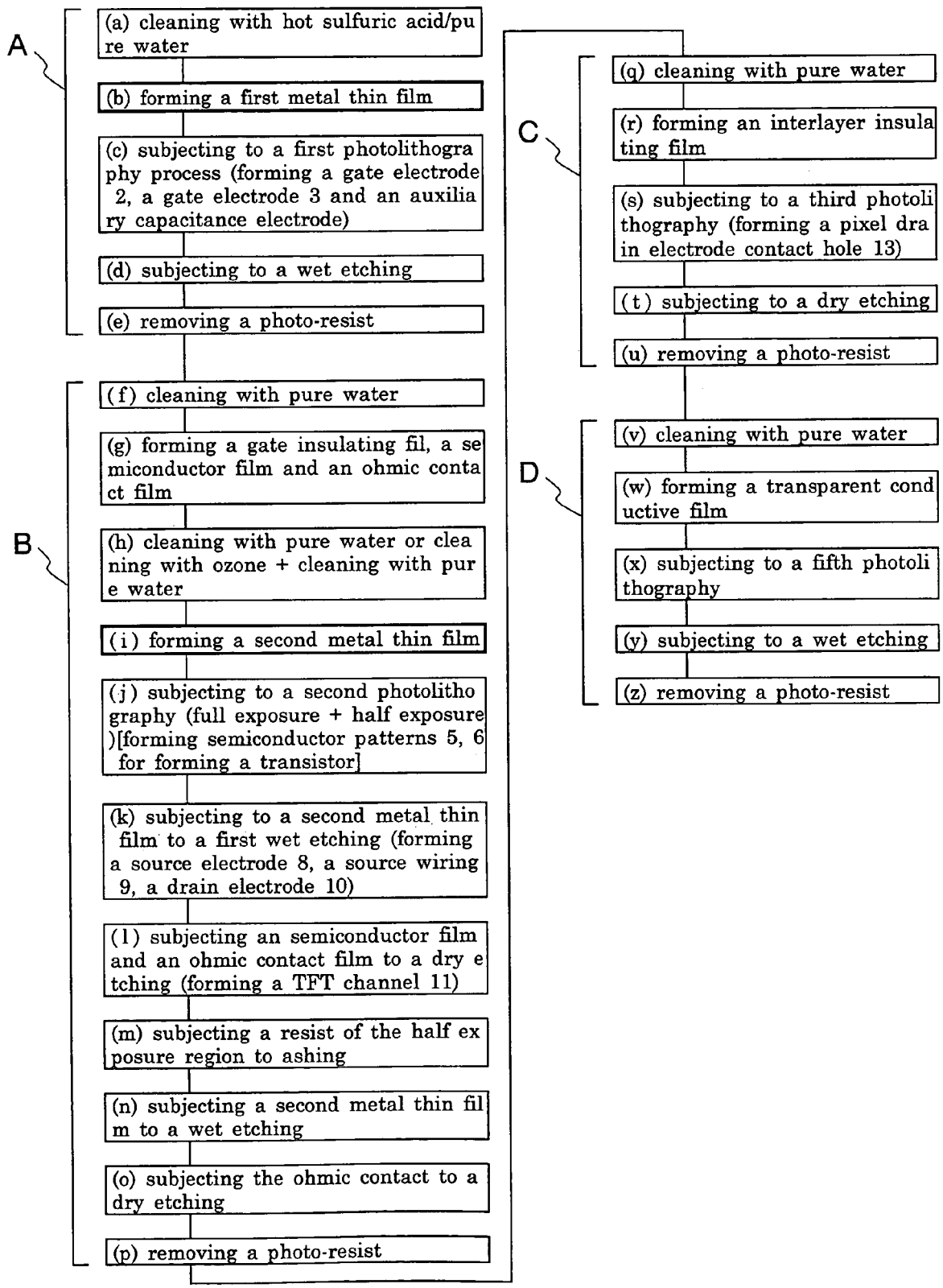
FIG. 9 is a flowchart showing manufacturing steps of the TFT array substrate for the liquid crystal display of Embodiments 2 to 5 of the present invention.

According to a step A shown in FIG. 9, the transparent insulating substrate 101 such as the glass substrate is cleaned with purified water or hot sulfuric acid, a first metal thin film is formed on the transparent insulating substrate 101 and patterned by the first photolithography to form the gate electrode 1, the gate wiring 21 and the subsidiary capacitor electrode 2.

As the first metal thin film, Al or Mo having low specific electric resistance or an alloy mainly composed of those is preferably used. As a preferred embodiment, first, an Al film 1a and 2a are formed to be 200 nm in thickness by sputtering using well-known Ar gas. A sputtering condition is such that a deposition power density is 3 W/cm$^2$ and an Ar gas flow rate is 40 sccm in a DC magnetron sputtering system. Then, AlN alloys 1b and 2b added with nitrogen (N) are formed to be 50 nm in thickness by reactive sputtering using gas in which nitrogen gas is mixed with well-known Ar gas. A sputtering condition is such that a deposition power density is 3 W/cm$^2$, an Ar gas flow rate is 40 sccm, and a nitrogen gas flow rate 20 sccm. Thus, two-layer film having the Al films 1a and 2a having a thickness of 200 nm and the AlN films 1b and 2b having a thickness of 50 nm formed thereon are formed. In addition, a N element composition of the upper AlN film 1b and 2b is about 18% by weight. Then, the two-layer film 1a and 2a, and 1b and 2b is etched away together by using the chemical agent containing well-known phosphoric acid and nitric acid and the photo-resist pattern is removed to form the gate electrode 1, the gate wiring 21 and the subsidiary capacitor electrode 2.

Then, according to a step B shown in FIG. 9, the gate insulating film 3 comprising silicon nitride (SiN), the semiconductor active layer 4 comprising the amorphous silicon, and the ohmic contact film 5 comprising n+ amorphous silicon to which an impurity is added are sequentially formed, and then a photo-resist pattern is patterned by the second photolithography, so as to include a first part positioned at a semiconductor active layer corresponding part which forms the thin film transistor, a second part which is thicker than at least the first part, and a third part which is thicker than the first and second parts.

As a preferred embodiment, a SiN film as the gate insulating film having a thickness of 400 nm, an amorphous silicon film as the semiconductor film having a thickness of 150 nm, and an n+ amorphous silicon film to which phosphorus (P) is added as an impurity, as the ohmic contact film having a thickness of 30 nm are sequentially formed by a chemical vapor deposition (CVD) method.

Then, in order to form the source electrode and the drain electrode, second metal films 6 and 7 are formed. As the second metal thin film, an alloy film in which Nb or W is added to Mo having advantages in which an specific electric resistance is low as described above, preferable contact characteristics with the ohmic contact film 5 is provided and contact electric resistance with the pixel electrode 11 is preferable is preferably used.

Figure 10A:
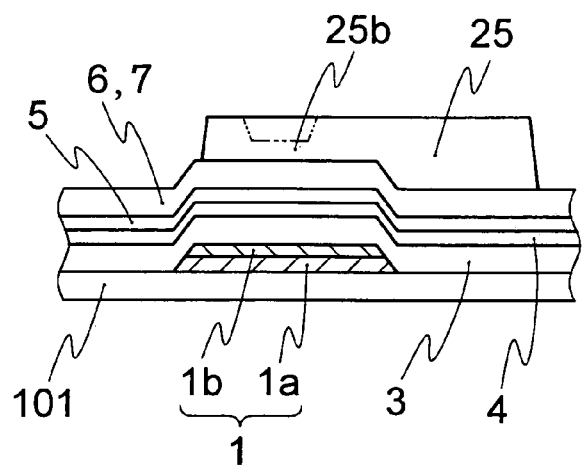
FIGS. 10(a), 10(b) and 10(c) are views showing resist patterns of the second photolithography of Embodiment 2 of the present invention.

As a preferable embodiment, a MoNb alloy in which Nb of 5% by weight is added to Mo is formed to be 200 nm in thickness by sputtering using well-known Ar gas. Then, as a preferred embodiment of a photo-resist pattern formed by the second photolithography, as shown in FIG. 10(a), a positive type photosensitive resist of novolac-type resin is applied so as to be about 1.6 μm in thickness by a spin coater and pre-baked for about 90 seconds at 120° C. Then, in order to form patterns of the TFT part semiconductor films 4, and 5, the source wiring 22, and the drain electrode 6, the first exposure is performed to form a photo-resist pattern 25. Then, in order to form the source electrode 7 and the channel part 24 of the TFT, the second exposure is performed to form a photo-resist pattern 25b. According to the photo-resist pattern 25b, since the photo-resist is not completely removed such that a thin film may be left, the second exposure is performed as half exposure with an exposure amount of about 40% of the first exposure.

Figure 10B:
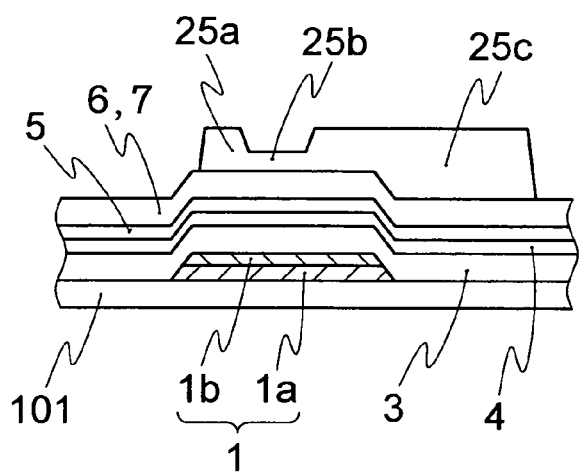

After the above two-step exposure, the photo-resist pattern is developed with an organic alkaline developer and post-baked for about 180 seconds at 120° C. to form a photo-resist pattern having three or more different thicknesses such as the first part 25b for the channel of the TFT, a second part 25a which is thicker than the first part and positioned above the gate electrode pattern 1, and a third part 25c which is thicker than the second part, as shown in FIG. 10(b). According to Embodiment 2, the photo-resist pattern is formed such that the thickness of the first part 25b is about 0.4 μm, the thickness of the second part 25a is about 1.4 μm and the film thickness of the third part 25c is about 1.6 μm. Although the two-step exposure is performed as described above in Embodiment 2, the photo-resist pattern having the parts 25a, 25b and 25c may be formed by single exposure using a halftone photomask in which transmission amount of the pattern at the part 25b may be about 40%. The halftone pattern mask is formed by forming a filter film which reduces the transmission amount of light in a wavelength range (normally 350 nm to 450 nm) used for the exposure, at the pattern positioned at the photomask 25b, or by using an optical diffraction phenomenon as a slit-shaped pattern. In the case the halftone mask is used, since the photo-resist patterns 25a, 25b and 25c shown in FIG. 10(b) can be formed by the single exposure, the process can be simplified.

Then, the second metal thin films 6 and 7 formed of a MoNb alloy are etched away by the first etching using photo-resist patterns 25a and 25c shown in FIG. 10(b) with a chemical agent containing well-known phosphoric acid and nitric acid. Then, the semiconductor film comprising amorphous silicon and the ohmic contact film 23 comprising n+ amorphous silicon are etched away by dry etching using well-known fluorine-contained gas to form the patterns of the TFT part semiconductor films 4 and 5, the source wiring 22 and the drain electrode 6.

Figure 10C:
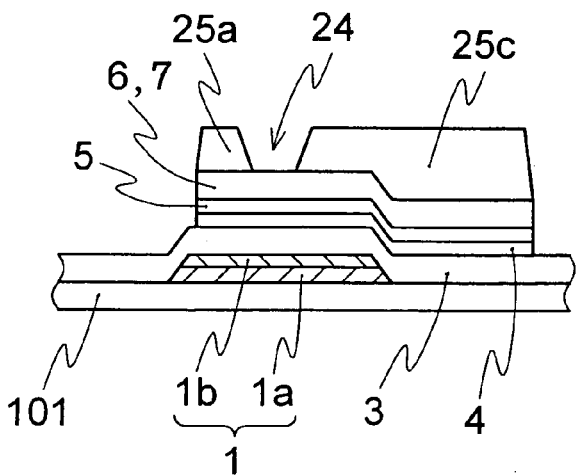
Figure 11:
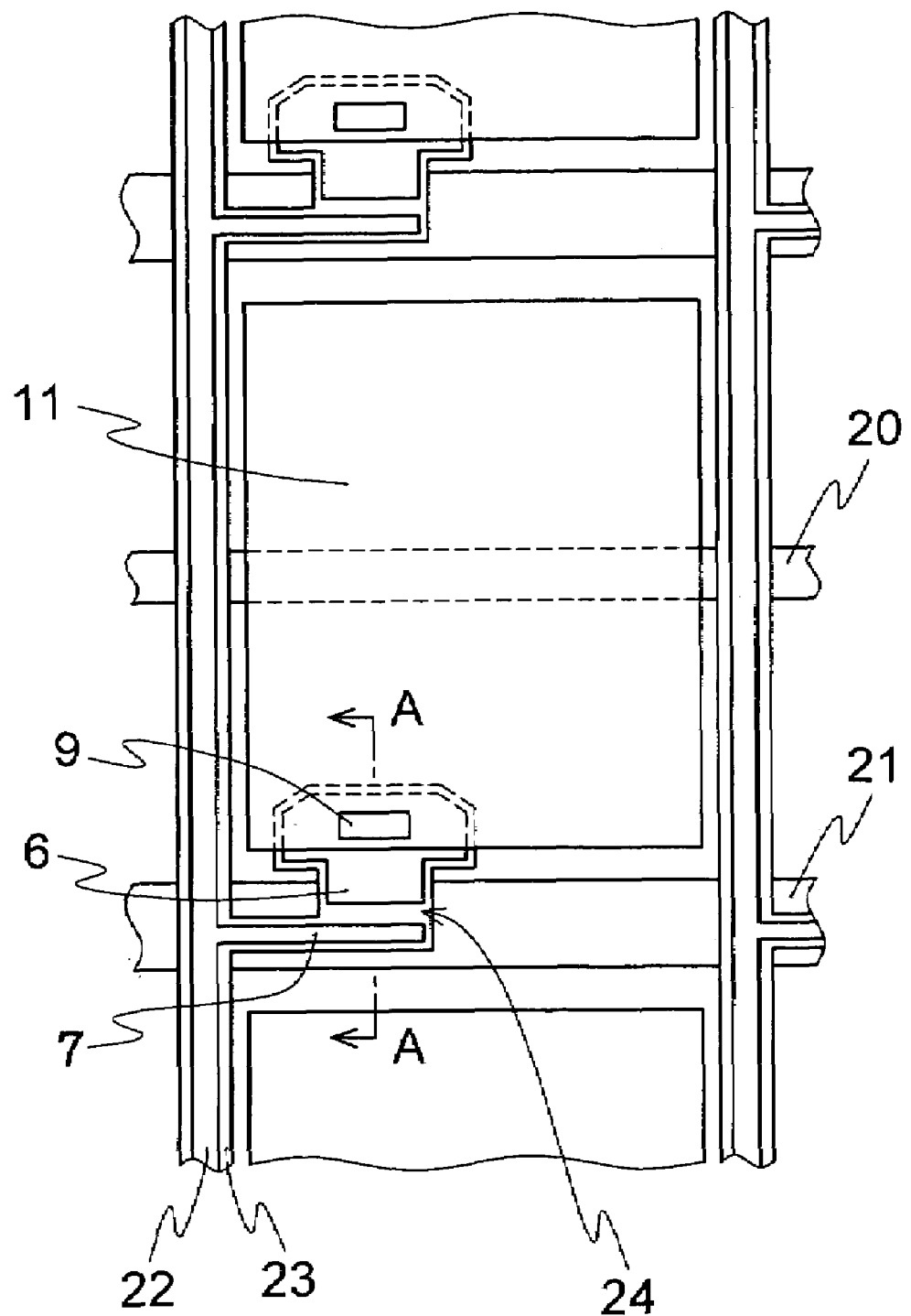
FIG. 11 is a plane view showing a conventional TFT array substrate for a liquid crystal display.
Figure 12:
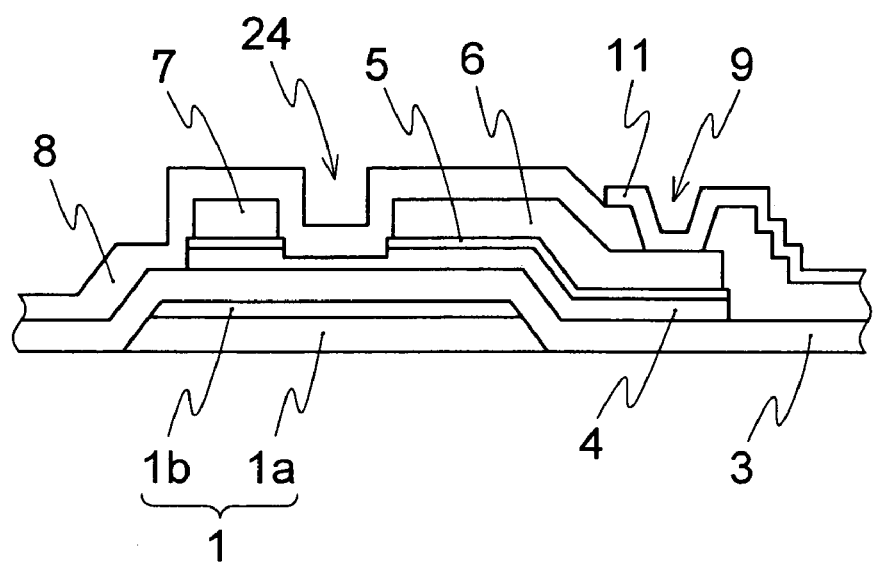
FIG. 12 is a sectional view taken along line A-A in FIG. 11.
Figure 13:
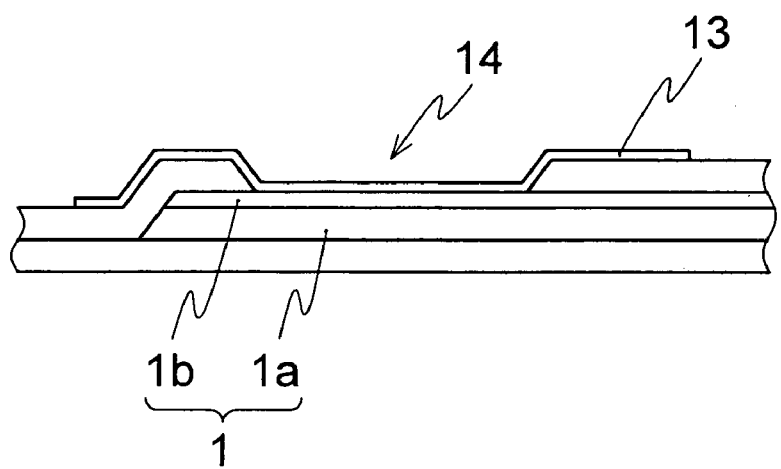
FIG. 13 is a sectional view showing a first TCP terminal connection part (gate terminal part) of the TFT array substrate for the liquid crystal display shown in FIG. 11.

Then, the photo-resist pattern 25 is etched away so that the resist 25b of the first part may be removed and the second and third parts 25a and 25c may be left, by photo-resist ashing using well-known oxygen plasma to form the photo-resist pattern 25a and 25c shown in FIG. 10(c) in which the part of the resist 25b positioned at the semiconductor active layer corresponding part 24 is opened.

Then, the second metal thin film formed of the MoNb alloy is etched away at the part 25b by the second etching using a well-known the chemical agent containing phosphoric acid and nitric acid. Then, the ohmic contact layer is removed and then the photo-resist patterns 25a and 25c are removed by dry etching using well-known fluorine-contained gas to form the source electrode 7, the source wiring 22, the drain electrode 6 and the channel part 24 of the TFT.

According to a step C shown in FIG. 9, the interlayer insulating film 8 comprising SiN is formed and patterned by the third photolithography and etching to form a pixel contact hole reaching at least a drain electrode surface of the second metal thin film, a first contact hole reaching a gate wiring terminal surface of the first metal thin film, and a second contact hole reaching a source wiring terminal surface of the second metal thin film at the same time.

As a preferable embodiment, a SiN film is formed so as to be 300 nm in thickness as the interlayer insulating film by chemical vapor deposition (CVD) and etched away by dry etching using well-known fluorine-contained gas and then the photo-resist pattern is removed to form the pixel drain electrode contact hole 9, a gate terminal part contact hole x and a source terminal part contact hole y (see FIG. 8).

Then, according to a step D shown in FIG. 9, a transparent conductive film is formed and patterned by the fourth photolithography and etching to form the pixel electrode 11 so as to be electrically connected to the lower drain electrode 6 through the pixel drain electrode contact hole 9, and a gate terminal and a source terminal so as to be electrically connected to the lower gate terminal part and the lower source terminal part through the second contact hole, so that the TFT array substrate for liquid crystal display according to Embodiment 2 of the present invention is completed.

As a preferred embodiment, an ITO film in which indium oxide ($In_2O_3$) and tin oxide ($SnO_2$) are mixed is formed to be 100 nm in thickness as the transparent conductive film by sputtering using well-known Ar gas and etched away using the chemical agent containing well-known hydrochloric acid and nitric acid and the photo-resist pattern is removed to form the pixel electrode 11 and a gate terminal (not shown) and a source terminal (not shown).

Compared with the conventional TFT array substrates (Comparative Examples 1 and 2) in which the first metal thin film is formed of a Cr film or Al film and the second metal thin film is formed of a Cr film, in view of characteristics of the TFT array substrate for the liquid crystal display of the present invention and the conventional TFT array substrate (Comparative Example) shown in Table 4, in the TFT array substrate completed as described above, the gate wiring electric resistance and the contact electric resistance of the terminal pad with the ITO film can be reduced by forming the first metal thin film with two-layer film of AlN/Al, and hillocks are prevented from being generated, so that an interlayer short-circuit defect between the first and second metal thin films through the insulating film can be prevented from being generated. Furthermore, since the second metal thin film is formed of MoNb, the source wiring electric resistance can be reduced and the contact electric resistance with the pixel ITO can be especially reduced, thereby to implement excellent display quality in which there is no display visual defects.

Although the first metal thin film comprises the two-layer film of the lower pure Al film 1a and 2a and the upper AlN film 1b and 2b to which nitrogen of about 18% by weight is added in Embodiment 2, the present invention is not limited to this. For example, as shown in FIG. 4, nitrogen may be added in a range of 5 to 26% by weight. Alternatively, C or O may be added instead of nitrogen. A kind of an element and its amount to be added can be easily changed only by appropriately changing a kind of gas and its flow rate to be mixed to Ar gas. For example, oxygen gas, carbon dioxide gas or atmospheric gas may be mixed with Ar gas instead of nitrogen gas to perform the reactive sputtering. In addition, instead of the pure Al film, there may be provided a two-layer film of AlNd—N/AlNd using an AlNd alloy film in which Nd is added by 0.1 to 5% by weight. In this case, in addition to the effect that the gate wiring electric resistance is reduced and the contact electric resistance with ITO film is reduced, since a margin for preventing generation of the hillocks in the process of heating can be raised, and a product yield and reliability can be improved, which is more preferable.

In addition, as the second metal thin film, a MoW alloy film to which W is added by 30 to 50% by weight can be used instead of the MoNb alloy film. In this case, although the contact electric resistance with the ITO film is increased a little as compared with the case of MoNb, the source wiring electric resistance and the contact electric resistance with the ITO film can be reduced as compared with Comparative Example 1.

Embodiment 3

In Embodiment 1 or 2, a MoNb alloy film in which Nb is added by 2.5 to 20% by weight is used as the first metal thin film instead of the two-layer film of AlN/Al. As a preferred embodiment, at step (b) in the step A shown in FIG. 3 or FIG. 9, a film of Mo—Nb of 5% by weight is formed to be 200 nm in thickness by sputtering using well-known Ar gas and patterned by the first photolithography to form a gate electrode 1, a gate wiring 21 and a subsidiary capacitor electrode 2. Then the same processes as those in Embodiment 1 or 2 are performed, and a TFT array substrate for a liquid crystal display according to Embodiment 3 of the present invention is completed. In this case, compared with Embodiment 1 or 2, although the gate wiring electric resistance value is increased, the contact electric resistance value with the ITO film can be lowered, whereby a margin for a display visual defect can be improved.

Embodiment 4

It is an object of Embodiment 4 to reduce source wiring electric resistance using an AlN/Al film as the second metal thin film instead of the MoNb single-layer film in Embodiment 1 or 2. However, since it is difficult for the Al film to provide a preferable electrical contact characteristic with the ohmic contact layer 5 formed of n+ amorphous silicon, it is necessary to form at least a three-layer film in which a MoNb layer to which Nb is added by 2.5 to 20% by weight is formed and then an AlN/Al film is formed thereon. As a preferred embodiment, at step (1) of the step C after the processes until step (k) of the step C shown in FIG. 3 were performed like Embodiment 1, or at step (i) of step B after the processes until step (h) of the step B shown in FIG. 9 were performed like Embodiment 2, a Mo—Nb alloy film in which Nb of 5% by weight is added is formed to be 50 nm in thickness by sputtering using well-known Ar gas. Then, an Al—Nd alloy film in which Nd of 2% by weight is added is formed to be 200 nm by sputtering using Ar gas and then AlNd—N film is formed to be 50 nm in thickness by reactive sputtering using gas in which nitrogen gas is added to Ar gas to form the three-layer film of AlNd—N/AlNd/MoNb. Then, in Embodiment 1, it is patterned by the third photolithography to form a source electrode 7, a source wiring 22 and a drain electrode 6, or in Embodiment 2, processes after the second photochemical engraving are performed. In this case, since the Mo—Nb film in which Nb is added by 5% by weight is used as the lowermost MoNb, the three-layer film can be etched away together using a chemical agent containing well-known phosphoric acid and nitric acid group as described in FIG. 6. Then, the same processes as in Embodiment 1 or 2 are performed and a TFT array substrate for a liquid crystal display according to Embodiment 4 is completed. In this case, compared with Embodiment 1 or 2, although the contact electric resistance between the ITO film and the source wiring formed of the second metal thin film is increased, the source wiring electric resistance can be lowered.

Although the three-layer AlNd—N/AlNd/MoNb film was formed as the second metal thin film in Embodiment 4, the same MoNb film having a thickness of about 50 nm as the lowermost layer may be used for the uppermost layer instead of the AlNd—N film of 50 nm in thickness. In this case, since the MoNb film in which Nb of 5 to 20% by weight is added is provided as the upper most and lower most layers, the source electrode 7, the source wiring 22 and the drain electrode 6 can be formed by single etching using the chemical agent containing well-known phosphoric acid and nitric acid group. In addition as shown in Table 2, since a dry etching selected ratio to SiN is improved as compared with the pure Mo film, when the pixel contact hole 9 is formed by the SiN dry etching process using well-known fluorine-contained gas at step (t) of the step D shown in FIG. 3, or step (t) of the step C shown in FIG. 9, the lower drain electrode 6 at the contact opening part can be prevented from being lost. Furthermore, the film thickness of the MoNb film of the lowermost and uppermost layers is not limited to 50 nm and it may be set arbitrarily. However, it is preferably set at least at 10 nm or more to form the uniform film stably and set in a range such that it does not exceed the film thickness of the AlNd film of the middle layer to keep the wiring electric resistance low. According to Embodiment 4, the source wiring electric resistance can be further lowered as compared with Embodiment 1 or 2.

Embodiment 5

In Embodiment 1 or 2, a MoNb alloy film in which Nb is added by 2.5 to 20% by weight is used as the upper layer of first metal thin film 1b, 2b instead of the AlNd-N thin film. As a preferred embodiment, at step (b) of the step A shown in FIG. 3 or FIG. 9, an Al—Nd film in which Nd of 2% by weight is added is formed to be 200 nm in thickness by sputtering using well-known Ar gas and a film of Mo—Nb of 5% by weight is formed to be 50 nm by sputtering using well-known Ar gas. Then, they are patterned by the first photolithography process to form a gate electrode 1, a gate wiring 21 and a subsidiary capacitor electrode 2. Then, the same processes as those in Embodiment 4 are performed, and a TFT array substrate for a liquid crystal display according to Embodiment 5 of the present invention is completed. In this case, compared with Embodiment 1 or 2, although the number of film forming processes is increased, since the source wiring electric resistance and the ITO/gate wiring contact electric resistance can be lowered, whereby there can be manufactured a TFT array substrate for a liquid crystal display in which a margin for a display unevenness can be improved and display quality is excellent.

In addition, although the ITO (indium oxide+tin oxide) film was used as the transparent conductive film in the above Embodiment 1 to Embodiment 5, the present invention is not limited to this and indium oxide ($In_2O_3$), tin oxide ($SnO_2$), zinc oxide (ZnO) or mixture of those may be used. When an IZO film in which zinc oxide is mixed with the indium oxide is used, for example, since weak acid such as oxalic acid group can be used as an etching solution instead of strong acid such as hydrochloric acid and nitric acid group used in the above embodiments, when the Al or Mo alloy having low acid resistance is used for the first and second metal films, it is further preferable because breaking corrosion of the Al alloy and Mo alloy films, which is caused by a chemical solution soaked therein, can be prevented. In addition, when an oxygen composition of the sputtered films of indium oxide, tin oxide and zinc oxide is less than stoichiometric composition, and a characteristic such as transmissivity or specific electric resistance is no good, it is preferable that the films are formed by using gas mixed with oxygen gas or $H_2O$ gas other than Ar gas only as the sputtering gas.

It is to be understood that the above-described arrangements are only illustrative of the application of the principles of the present invention. Numerous modifications and alternative arrangements may be devised by those skilled in the art without departing from the scope of the present invention, and appended claims are intended to cover such modifications and arrangements.

What is claimed is:

1. Method for manufacturing a thin film transistor array substrate for a liquid crystal display comprising a thin film transistor array;
   said thin film transistor array substrate comprising:
   display pixels each having a pixel electrode electrically connected to a thin film transistor, said display pixels being formed in a shape of a matrix on a first insulating substrate;
   wherein each thin film transistor along a line of the matrix is scanned and selected sequentially by a gate wiring and applied a signal by a source wiring to the pixel electrode, said gate wiring and said source wiring are formed so as to cross each other in the shape of the matrix;
   wherein a liquid crystal layer is interposed between said thin film transistor array substrate and a counter substrate, said counter substrate having color filters and a common electrode formed on a second insulating substrate, and said thin film transistor array substrate is attached to said counter substrate through said liquid crystal layer by a sealing material;
   and wherein polarization plates are provided outsides of said thin film transistor array substrate and the counter substrate, respectively;
   said manufacturing method comprising the steps of:
   (a) forming a first metal thin film layer on the first insulating substrate, thereafter subjecting the first metal thin film layer to patterning by a first photolithography to form the gate wiring and a gate electrode of the thin film transistor;
   (b) sequentially forming a gate insulating film layer, a semiconductor film layer, an ohmic contact film layer and a second metal thin film layer, thereafter forming a photo resist pattern on the second metal thin film layer by a second photolithography so as to contain a first part positioned on top of the semiconductor active layer where the thin film transistor is to be formed, a second part thicker than the first part and a third part thicker than the first and second parts, etching the second metal film, the ohmic contact film and the semiconductor film, thinning the photo resist pattern, removing the first part of the photo resist pattern, removing the second metal film under the first part of the photo resistor pattern where the thin film transistor is to be formed by etching, and removing the ohmic contact film under the first part of the photo resistor pattern where the thin film transistor is to be formed to form the thin film transistor having the semiconductor active layer;
   (c) forming an interlayer insulating film on the second metal thin film, thereafter subjecting said interlayer insulating film to a third photolithography so as to form a pixel contact hole reaching at least a surface of said second metal film that forms a drain electrode, a first contact hole reaching a surface of said first metal thin film, and a second contact hole reaching a surface of said second metal thin film; and
   (d) forming a transparent conductive film on the interlayer insulating film, thereafter subjecting said transparent conductive film to patterning by a fourth photolithography so as to form the pixel electrode;
   wherein said first metal thin film has a two-layered structure comprising a first layer made of an aluminum alloy containing aluminum and neodymium and a second layer located on said first layer, said second layer is obtained by adding at least one element of nitrogen, carbon and oxygen as dopant to the aluminum alloy, and wherein said second metal thin film is formed of an alloy mainly containing molybdenum.

2. The method of claim 1, wherein said aluminum alloy comprises aluminum as a main component, and at least one of titanium, vanadium, chrome, zirconium, niobium, molybdenum, hafnium, tantalum, tungsten, lanthanum, neodymium, samarium, gadolinium and yttrium is added to aluminum.

3. The method of claim 1, wherein said aluminum alloy comprises an alloy containing neodymium of 0.1 to 5% by weight.

4. The method of claim 1, wherein said second layer of said first metal thin film is obtained by adding nitrogen as the dopant to the aluminum alloy, and said second layer is formed by a reactive sputtering using a sputtering target of the aluminum alloy and a mixture of Ar gas and nitrogen gas.

5. The method of claim 1, wherein said second metal thin film is a molybdenum alloy comprising molybdenum as a main component, and at least one of titanium, vanadium, chrome, zirconium, niobium, tantalum and tungsten is added to molybdenum.

6. The method of claim 1, wherein said second metal thin film is a molybdenum alloy comprising molybdenum as a main component, and said molybdenum alloy contains niobium of 2.5 to 20% by weight.

7. The method of claim 1, wherein said transparent conductive film comprises indium oxide, tin oxide, zinc oxide or mixture of at least two of indium oxide, tin oxide or zinc oxide.

8. The method of claim 1, wherein said second layer is obtained by adding nitrogen as dopant to the aluminum alloy, and wherein nitrogen concentration in the aluminum alloy is 5 to 26% by weight.

9. The method of claim 1, wherein said second metal thin film is a molybdenum tungsten alloy and tungsten concentration of the molybdenum tungsten alloy is 30 to 50% by weight.

* * * * *

UNITED STATES PATENT AND TRADEMARK OFFICE
CERTIFICATE OF CORRECTION

PATENT NO. : 7,400,365 B2 Page 1 of 1
APPLICATION NO. : 10/900607
DATED : July 15, 2008
INVENTOR(S) : Fumihiro Gotoh et al.

It is certified that error appears in the above-identified patent and that said Letters Patent is hereby corrected as shown below:

On patent cover, in line 5 of the Abstract, please delete "." and insert --,-- therefor.

In column 1 at line 26, please delete "TET" and insert --TFT-- therefor.

In column 1 at line 34, please delete "TET" and insert --TFT-- therefor.

In column 2 at line 6, please delete "TOP" and insert --TCP-- therefor.

In column 3 at line 3, please delete "existence" and insert --resistance-- therefor.

In column 8 at line 44, please delete "Embodiments" and insert --Embodiment-- therefor.

Signed and Sealed this

Twenty-eighth Day of October, 2008

JON W. DUDAS
*Director of the United States Patent and Trademark Office*